(12) United States Patent
Sullivan et al.

(10) Patent No.: US 8,784,147 B2
(45) Date of Patent: Jul. 22, 2014

(54) COMPOSITE ASSEMBLY FOR AN ELECTRICAL CONNECTOR AND METHOD OF MANUFACTURING THE COMPOSITE ASSEMBLY

(75) Inventors: Mary Elizabeth Sullivan, Lancaster, PA (US); Robert Daniel Hilty, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 200 days.

(21) Appl. No.: 13/526,127

(22) Filed: Jun. 18, 2012

(65) Prior Publication Data

US 2012/0314339 A1 Dec. 13, 2012

Related U.S. Application Data

(63) Continuation-in-part of application No. 12/794,842, filed on Jun. 7, 2010, now Pat. No. 8,216,006.

(60) Provisional application No. 61/268,166, filed on Jun. 9, 2009.

(51) Int. Cl.
*H01R 13/02* (2006.01)
*H01R 9/24* (2006.01)

(52) U.S. Cl.
USPC .................................... 439/886; 439/620.16

(58) Field of Classification Search
CPC .............. C25D 9/02; C25D 9/08; C25D 9/04; C25D 13/02; C25D 13/04; C25D 15/00; C25D 13/06; H01R 13/6586; H01R 13/03; H01L 28/55; H01L 28/75; H01G 4/12

USPC .......... 439/886, 620.16, 620.09, 620.12, 887; 361/321.1; 204/490, 489; 205/109
See application file for complete search history.

(56) References Cited

U.S. PATENT DOCUMENTS

| 2,843,541 | A | | 7/1958 | Senderoff et al. |
| 4,584,074 | A | * | 4/1986 | Sterling et al. ................ 204/487 |
| 4,896,250 | A | * | 1/1990 | Sullivan ....................... 361/523 |
| 5,003,428 | A | | 3/1991 | Shepherd |
| 5,414,220 | A | | 5/1995 | Hanato et al. |

(Continued)

FOREIGN PATENT DOCUMENTS

| CN | 1455933 A | 11/2003 |
| EP | 0 645 849 | 3/1995 |

(Continued)

OTHER PUBLICATIONS

European Search Report, international Application No. EP 10 16 5429, Sep. 30, 2010.

(Continued)

*Primary Examiner* — Javaid Nasri

(57) ABSTRACT

A method of manufacturing a composite assembly includes providing a fluid bath and adding a ceramic material to the fluid bath. The ceramic material comprises a plurality of ceramic particles, wherein the plurality of ceramic particles is devoid of a conductive coating. The method further includes immersing at least part of a conductive substrate in the fluid bath. The method also includes applying a voltage potential between the fluid bath and the conductive substrate, whereby the ceramic material is electrodeposited onto the conductive substrate as at least a portion of a dielectric layer.

19 Claims, 5 Drawing Sheets

(56) References Cited

U.S. PATENT DOCUMENTS

| | | |
|---|---|---|
| 7,256,983 B2 | 8/2007 | Ozawa et al. |
| 7,540,781 B2 | 6/2009 | Kenny et al. |
| 8,157,598 B2 | 4/2012 | Nittsu |
| 2003/0151032 A1 | 8/2003 | Ito et al. |
| 2009/0301770 A1 | 12/2009 | Cho et al. |
| 2010/0311289 A1 | 12/2010 | Sullivan et al. |
| 2011/0230096 A1 | 9/2011 | Atkinson et al. |
| 2012/0314339 A1 | 12/2012 | Sullivan et al. |

FOREIGN PATENT DOCUMENTS

| | | |
|---|---|---|
| EP | 2261400 A1 | 12/2010 |
| GB | 2 117 796 | 10/1983 |
| GB | 2 150 153 | 6/1985 |
| GB | 2 158 463 | 11/1985 |
| WO | WO 2005/100642 | 10/2005 |

OTHER PUBLICATIONS

International Search Report for International Application No. PCT/US2013/023760, dated Apr. 29, 2013.

Ranjbar, Z. et al., "Morphology and electrical conductivity behavior of electro-deposited conductive carbon black-filled epoxy dispersions near the insulator-conductor transition point", *Colloids and Surfaces, A., Physiochem. Eng. Aspects*, Elsevier, Amsterdam, vol. 290, No. 1-3, Nov. 15, 2006, pp. 186-193.

\* cited by examiner

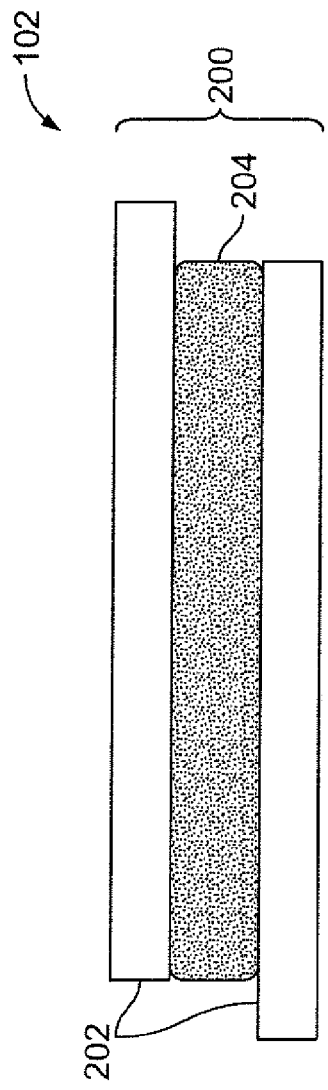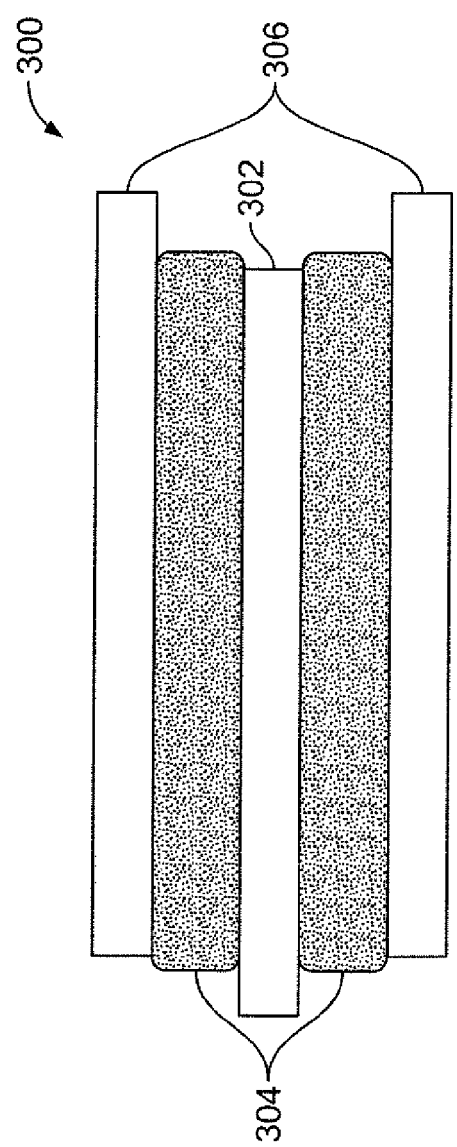

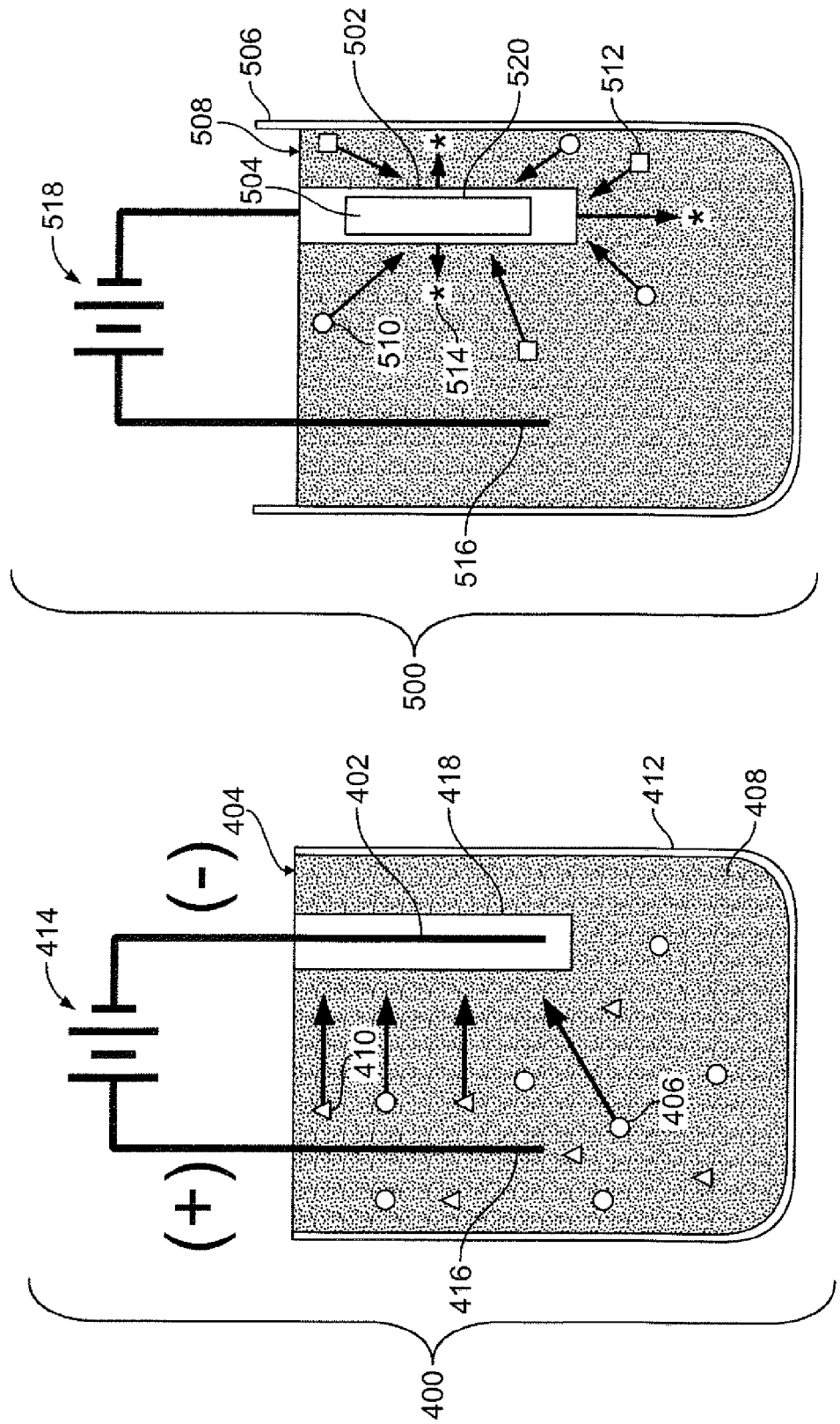

COMPOSITE ASSEMBLY FOR AN ELECTRICAL CONNECTOR AND METHOD OF MANUFACTURING THE COMPOSITE ASSEMBLY

CROSS-REFERENCE TO RELATED APPLICATIONS

This application is a continuation-in-part application of U.S. patent application Ser. No. 12/794,842, entitled "Composite Assembly For An Electrical Connector And Method Of Manufacturing The Composite Assembly" (the "'842 application"). The '842 application was filed on Jun. 7, 2010. This application claims priority benefit to the '842 application. The entire subject matter described in the '842 application is hereby incorporated by reference.

The '842 application is a nonprovisional application of U.S. Provisional Application No. 61/268,166, entitled "Inherent Capacitor And Electrical Insulation Design Using Electrocoat" (the "166 application"). The '166 application was filed on Jun. 9, 2009. The '842 application claims priority benefit to the '166 application. The entire subject matter described in the '166 application is hereby incorporated by reference.

BACKGROUND OF THE INVENTION

One or more embodiments of the subject matter described herein generally relate to the electrodeposition of dielectric and/or polymer materials onto a conductive substrate to form composite assemblies for electrical connectors.

Known industries such as the automotive industry use electrocoating, or "e-coating," to provide protection to metal components, such as protection from corrosion and acids. Electrocoating also is used to aesthetically enhance the appearance of metallic components. In general, e-coating systems deposit polymers onto metallic substrates using electricity, or a voltage differential between the metallic substrates and a liquid bath that includes the polymers.

Growing demands for miniaturization, improved performance, and reduced cost and weight of electronic components has driven intense research for novel materials and manufacturing processes to meet these demands. In order to improve signal quality in high speed electrical connectors, capacitive elements may be included along or near the signal path in the connector and/or at a mating interface between the connector and another mating connector. For example, some known connectors are mounted onto circuit boards with capacitors mounted onto the printed circuit board adjacent to the connectors and along the signal path extending from the connector and through the circuit board. Adding discrete capacitors to circuit boards, however, consumes additional areas of the limited available surface area on the circuit board.

Other known connectors include a separate, discrete capacitor that is coupled to the signal paths in the connectors using known manufacturing methods, such as solder. Joining a separate capacitor to the signal path, however, may lead to problems in matching the electrical impedance of the signal path with the impedance through the capacitor and circuit board. Additionally, solder may introduce risks of reliability concerns as the joint between the solder and the signal path of the connectors can be brittle and easy to break.

Some known capacitive elements are created by covering a conductive tape with a thin film of dielectric material. Adhesion of the dielectric material to the conductive tape is generally poor, thereby resulting in delamination of the dielectric material from the conductive tape. Additionally, the dispersion of the dielectric material on the tape may be uneven, resulting in an inhomogeneous dispersion of the dielectric material on the tape.

Electric insulation is needed in some applications to prevent conduction of current between metallic conductors. In some known manufacturing processes, injection molding, overmolding, and/or dip coating is used to provide insulation on the conductors. These known processes, however, may be insufficient for some products due to dimensional tolerance control limits, the relatively high cost involved in the processes, and/or inadequate control over the thicknesses of the coatings. Additionally, some known coatings are heavier and/or thicker than desired in order to provide sufficient insulation performance. With respect to injection molded articles that may be used as an insulative coating, the articles generally are too large for many applications as the minimum wall thickness of the articles tends to be relatively large.

A need exists to provide a composite assembly and method of manufacturing the composite assembly that provides an inherent or integrated capacitive element for a signal path of an electrical connector. A need also exists for a composite assembly and method of manufacturing the assembly that provides insulation and/or protection for conductive members without the increased weight, cost, and tolerances associated with some known manufacturing processes.

BRIEF DESCRIPTION OF THE INVENTION

In one embodiment, a method of manufacturing a composite assembly for an electrical connector is provided. The method includes providing a fluid bath. The method also includes adding a ceramic material to the fluid bath. The ceramic material comprises a plurality of ceramic particles, wherein the plurality of ceramic particles is devoid of a conductive coating. The method further includes immersing at least part of a conductive substrate in the fluid bath. The method also includes applying a voltage potential between the fluid bath and the conductive substrate, whereby the ceramic material is electrodeposited onto the conductive substrate as at least a portion of a dielectric layer.

In another embodiment, a method of manufacturing a composite assembly for an electrical connector is provided. The method includes providing a fluid bath. The method also includes adding a ceramic material to the fluid bath. The ceramic material comprises a plurality of ceramic particles, wherein the plurality of ceramic particles is devoid of a conductive coating. Also, the method includes adding a ceramic polymer to the fluid bath. The polymer comprises a plurality of polymer particles, wherein the plurality of polymer particles is devoid of a conductive coating. The method further includes immersing at least part of a conductive substrate in the fluid bath. The method also includes applying a voltage potential between the fluid bath and the conductive substrate, whereby the plurality of ceramic particles and the plurality of polymer particles are concurrently electrodeposited onto the conductive substrate as at least a portion of a dielectric layer.

In another embodiment, an electrical contact is provided. The electrical contact includes a first conductive substrate, a second conductive substrate, and an electrodeposited thin film layer interposed between the first and second conductive substrates. The electrodeposited thin film layer includes a ceramic material that includes a plurality of ceramic particles devoid of a conductive coating.

BRIEF DESCRIPTION OF THE DRAWINGS

FIG. 2 is a cross-sectional view of one of the contacts shown in FIG. 1 in accordance with one embodiment.

FIG. 3 is a cross-sectional view of a contact in accordance with another embodiment.

FIG. 4 is a diagram of an electrodepositing system in accordance with one embodiment.

FIG. 5 is a diagram of a chemically reactive deposition system in accordance with one embodiment.

DETAILED DESCRIPTION OF THE INVENTION

Figure 1:
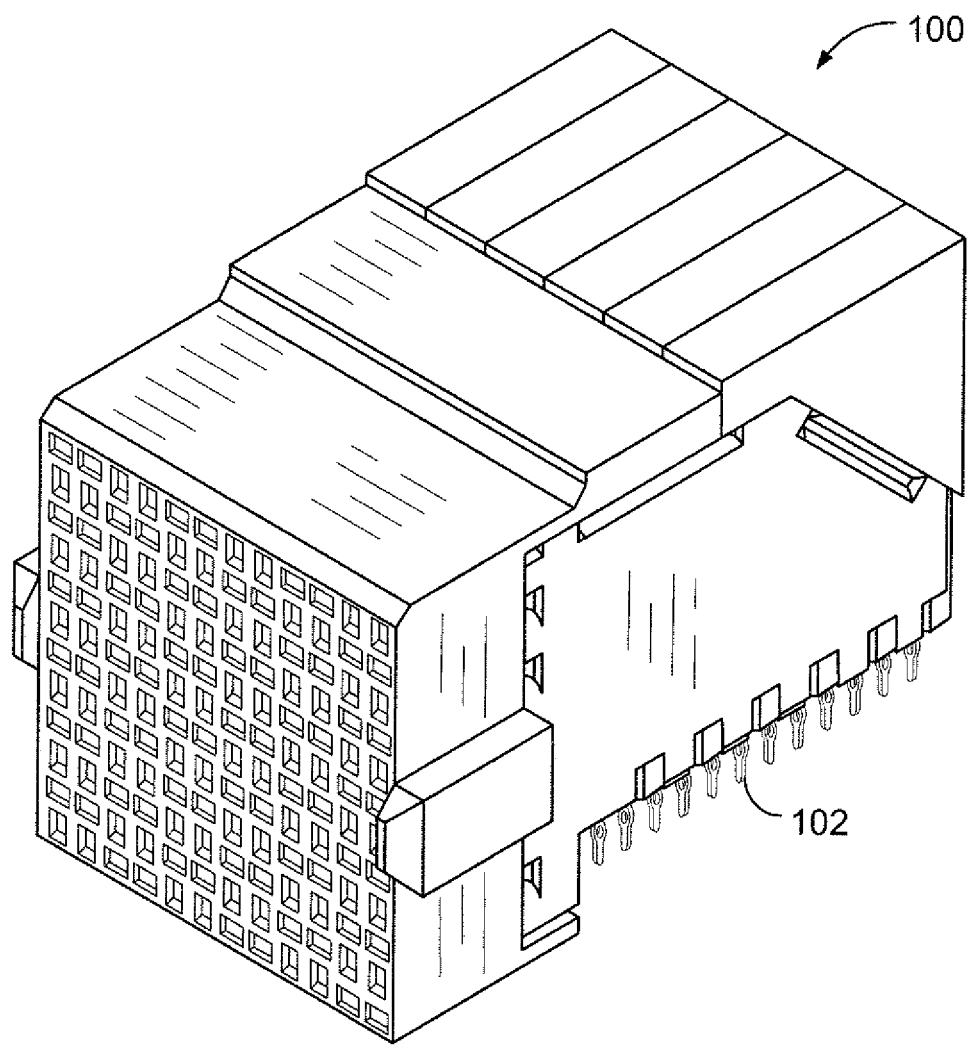
FIG. 1 is a perspective view of an electrical connector having composite assemblies as contacts in accordance with an example of one embodiment.

FIG. 1 is a perspective view of an electrical connector 100 having composite assemblies as contacts 102 in accordance with an example of one embodiment. The connector 100 is used to illustrate merely one example of a wide variety of devices that may incorporate one or more embodiments of the subject matter described herein. The connector 100 depicted in FIG. 1 is not intended to limit all embodiments described herein to the connector 100. The connector 100 includes several contacts 102. The contacts 102 include conductive materials and provide conductive paths for the connector 100 to convey electric voltage and/or current. For example, the contacts 102 may be signal contacts that communicate electronic data signals with a circuit board (not shown) or another connector, ground contacts that electrically join an electromagnetic shield of the connector 100 with a ground reference, power contacts that transmit electric power to and/or from the connector 100, and the like. In accordance with one embodiment, the contacts 102 are capacitive contacts.

FIG. 2 is a cross-sectional view of the contact 102 in accordance with one embodiment. The contacts 102 may be multi-layered capacitive contacts formed from composite assemblies 200. For example, the contacts 102 may have integrated or inherent capacitive members formed by conductive and dielectric layers. The composite assemblies 200 include conductive substrates 202 separated by a dielectric layer 204. The conductive substrates 202 include or are formed from conductive materials such as a metal, metal alloy, or conductive carbon-based materials. For example, the conductive substrates 202 may be formed from copper (Cu) or a copper alloy. The dielectric layer 204 is deposited onto one or more of the conductive substrates 202. The dielectric layer 204 may be or include a material that has a relatively high dielectric constant (Dk). For example, the dielectric layer 204 can include or be formed from one or more materials having a dielectric constant (Dk) that is greater than 3.0. Alternatively, the dielectric constant (Dk) of the material(s) in the dielectric layer 204 may be at least 4.2. In another example, the dielectric constant (Dk) of the material(s) in the dielectric layer 204 may be at least 100. Such materials may be referred to herein as "high-dielectric materials." Alternatively, the dielectric layers 204 may have materials with lower dielectric constant (Dk). For example, the dielectric layers 204 may have a dielectric constant (Dk) of 3.0 or less.

In one embodiment, the dielectric layer 204 is electrodeposited, or "e-coated," onto one or more of the conductive substrates 202. For example, the dielectric layer 204 may be deposited on the conductive substrates 202 by electrodepositing the dielectric material onto the conductive substrates 202 or by co-electrodepositing the dielectric material and a polymer onto the conductive substrates 202. In another embodiment, the dielectric layer 204 is deposited by a chemical reaction of the reactive precursor materials. The reactive precursor materials react on or at the surface of the conductive substrate 202. The reaction causes the dielectric layer 204 to be deposited on the conductive substrate 202.

FIG. 3 is a cross-sectional view of a contact 300 in accordance with another embodiment. The contact 300 may be similar to the contact 102 (shown in FIG. 1) with one difference being that the contact 300 includes a conductive substrate 302 with several alternating layers of dielectric layers 304 and conductive layers 306 disposed thereon. The dielectric layers 304 may be similar to the high-dielectric layer 204 (shown in FIG. 2). The conductive layers 306 and/or conductive substrate 302 may be films of metal or metal alloys that are deposited onto the dielectric layers 304 and/or conductive substrate 302.

FIG. 4 is a diagram of an electrodepositing system 400 in accordance with one embodiment. The electrodepositing system 400 is used to "electrocoat" at least a portion of a conductive substrate 402, such as the conductive substrate 202 and/or 302 (shown in FIGS. 2 and 3). A fluid bath 404 is provided in a container 412. The fluid bath 404 may be a liquid bath that includes a dielectric material 406, such as a ceramic material, suspended in the bath 404. Alternatively, the fluid bath 404 may be a gaseous bath that includes the dielectric material 406 dispersed in gaseous form. For example, the fluid bath 404 may a gas in a chemical vapor deposition (CVD), plasma-enhanced CVD (PECVD) or other type of vapor deposition chamber.

The dielectric material 406 in the fluid bath 404 may have a relatively high dielectric constant (Dk), such as greater than 3.0, 3.9, 4.2, or 100. By way of example only, the dielectric material 406 may be barium titanate ($BaTiO_3$), hafnium oxide or hafnium dioxide ($HfO_2$), and/or alumina or aluminum oxide ($Al_2O_3$). Other materials for the dielectric material 406 include metal oxides, a mica material, micalex, hafnium silicate ($HfSiO_4$), barium titanate niobate ($Ba_6Ti_2Nb_8O_{30}$), lead hafnate ($PbHfO_3$), lead magnesium niobate ($Pb_3MgNb_2O_9$), lead metatantalate ($PbTa_2O_6$), lead sulfide ($PbS$), lead titanate ($PbTiO_3$), lead zirconate ($PbZrO_3$), nitrided hafnium silicate (HfSiON), tantalum oxide ($Ta_2O_5$), zirconium dioxide ($ZrO_2$), titanium dioxide ($TiO_2$), strontium titanate ($SrTiO_3$), tungsten trioxide ($WO_3$), zirconium silicate ($ZrSiO_4$), and/or calcium titanate ($CaTiO_3$). The dielectric material 406 in the fluid bath may also have a low dielectric constant (Dk), such as 3.0 or lower. For example, the dielectric material 406 may include boron nitride (BN), magnesium carbonate ($MgCO_3$), and/or diamond.

The bath 404 also includes a solvent 408 in which the dielectric material 406 is dispersed. For example, the bath 404 may include a liquid solvent 408 with particles of the dielectric material 406 mixed into the solvent 408 as solutes. In one embodiment, the bath 404 includes a ceramic material, such as barium titanate ($BaTiO_3$), as the dielectric material 406. The ceramic material may be dispersed in the liquid solvent 408 of an alcohol, such as ethanol. Other examples of materials that may be used for the solvent 408 include acetone, water, and the like. In one embodiment, the bath 404 includes hafnium oxide ($HfO_2$) as the dielectric material 406 and ethanol or water as the solvent 408. In one embodiment, particles of hafnium oxide ($HfO_2$) are provided with a coating of alumina ($Al_2O_3$) prior to mixing the hafnium oxide ($HfO_2$) in the ethanol or water. The alumina ($Al_2O_3$) may assist in more evenly dispersing the hafnium oxide ($HfO_2$) in the ethanol or water. By way of example only, the coating of alumina ($Al_2O_3$) may be approximately 0.5 to 9 nanometers thick. Alternatively, different thicknesses and/or coatings may be used.

In one embodiment, the bath 404 includes a polymer material 410. For example, in addition to the dielectric material 406, the bath 404 may include particles of a polymer dispersed in the solvent 408. The polymer material 410 may be an acrylic material, an epoxy material, and/or a thermoplastic material. As described below, the polymer material 410 is co-deposited with the dielectric material 406 onto the conductive substrate 402 in one embodiment. Alternatively, the bath 404 does not include the polymer material 410, and the dielectric material 406 is deposited onto the conductive substrate 402 without the polymer material 410.

The conductive substrate 402 is at least partially inserted into the bath 404. For example, in an embodiment where the bath 404 is a liquid bath, the conductive substrate 402 may be lowered into the bath 404. Alternatively, in an embodiment where the bath 404 is a gaseous bath, the conductive substrate 402 may be placed into the container 412 that houses the gaseous bath.

The conductive substrate 402 is electrically coupled with a power source 414, such as a battery or electrical power supply. A conductive counter electrode 416 also is at least partially inserted into the bath 404. The counter electrode 416 is electrically coupled with the power source 414. The power source 414 applies a voltage potential across the conductive substrate 402 and the counter electrode 416. For example, the power source 414 may apply a voltage potential between the conductive substrate 402 and the counter electrode 416. In the illustrated embodiment, the power source 414 applies a positive charge to the counter electrode 416 and a negative charge to the conductive substrate 402. Alternatively, a negative charge may be applied to the counter electrode 416 while a positive charge is applied to the conductive substrate 402. The voltage potential between the conductive substrate 402 and the counter electrode 416 and/or bath 404 causes the dielectric and/or polymer materials 406, 410 to be electrodeposited onto the conductive substrate 402. In one example, the negatively charged conductive substrate 402 drives the dielectric material 406 and/or the polymer material 410 toward the conductive substrate 402.

In one embodiment, both the dielectric and polymer materials 406, 410 are co-electrodeposited onto the conductive substrate 402 as an electrodeposited dielectric layer 418. The dielectric layer 204 and/or the dielectric layer 304 (shown in FIGS. 2 and 3) may be deposited as the dielectric layer 418. For example, the dielectric and polymer materials 406, 410 may be simultaneously or concurrently deposited on the conductive substrate 402. Alternatively, the dielectric material 406 is deposited onto the conductive substrate 402 without the polymer material 410. For example, if the bath 404 does not include the polymer material 410, then the dielectric material 406 alone may be deposited onto the conductive substrate 402.

The electrodeposition of the dielectric and/or polymer materials 406, 410 onto the conductive substrate 402 may provide improved adhesion of the dielectric and/or polymer materials 406, 410 when compared to other techniques for applying the dielectric and/or polymer materials 406, 410 to the conductive substrate 402. Additionally, the electrodeposition of the dielectric and/or polymer materials 406, 410 may result in an approximately uniform or even distribution of the dielectric and/or polymer particles of the dielectric and/or polymer materials 406, 410 throughout the dielectric layer 418. For example, the dispersion or distribution of the dielectric and polymer materials 406, 410 in the dielectric layer 418 may be approximately homogeneous.

After the dielectric layer 418 has been provided on the conductive substrate 402, one or more additional conductive layers, such as the conductive substrate 202, the conductive substrate 302 and/or the conductive layer 306 (shown in FIGS. 2 and 3), may be deposited on the dielectric layer 418. In one embodiment, the conductive substrate 402 and dielectric layer 418 are placed into another bath (not shown) having a solution that includes a conductive material, such as metal or metal alloy ion or particles. A voltage potential may be applied between the conductive substrate 402 and the counter electrode 416. The electrodeposition of alternating conductive layers and dielectric layers 418 may be repeated to form layered structures, similar to the contact 300 shown in FIG. 3.

Thus, by electrodeposition of a layer including a ceramic and/or a polymer as discussed above, embodiments, for example, provide for improved thin film dielectric layers on, for example, an electrical contact. For example, embodiments provide a composite capacitive electrical contact including an electrodeposited thin film dielectric layer. By selecting appropriate materials and process parameters, a coating of a given thickness may provide a desired dielectric constant and desired inherent or integral capacitive properties for an electrical contact. The electrodeposition allows for improved uniformity and coverage of the dielectric material(s). Also, such a technique may provide for more efficient production processes when compared to techniques such as the application of a tape or film. Embodiments provide for dielectric layers comprising a ceramic material, a polymer material, or both.

In embodiments, the dielectric material 406 comprises a ceramic material. The ceramic material in turn comprises a plurality of ceramic particles such as, for example, ceramic crystals. The ceramic material has a given throw power. Throw power may be defined as a particle's ability to be drawn toward an electrode (such as the conductive substrate 402 that is charged with electric current), which may also, for example, determine a material's ability to coat surfaces having irregular shapes. A ceramic material used for such embodiments may be selected from a group having a sufficient throw power so that the ceramic can adhere to a conductive substrate without requiring any additional surface treatment, such as a conductive coating or other addition to an exterior surface of particles of the ceramic material.

The solvent 408, for example, may be a protic solvent. A protic solvent is a solvent that can disassociate $H^+$ ions. Such solvents also typically have generally high dielectric constants. Water is an example of a protic solvent. Thus, in embodiments, ceramic particles may be added to a bath containing water, such as the bath 404 that includes water. When placed in such a bath 404, a ceramic having a desired dielectric constant as well as a sufficient throw power will be drawn to the conductive substrate 402 when an adequate voltage is applied to the conductive substrate 402, and form an electrodeposited layer (e.g., the dielectric layer 418) on the conductive substrate 402.

Thus, by selecting appropriate process parameters, such as the voltage potential applied, the time for which the voltage is applied, the composition of the solvent, and selecting of a ceramic with a sufficient throw power, unmodified ceramic particles (e.g., ceramic particles without a conductive coating disposed thereon) may be used to provide a thin film deposited dielectric layer 418 that provides a desired capacitance to an electrical contact (e.g., the substrate 402). Non-conductively coated ceramic particles may thus be electrodeposited to provide desired capacitive characteristics or performance. The term non-conductively coated ceramic particle is used to describe ceramic particles that do not have any coating before addition to a bath for electrodeposition, as well as ceramic particles that have received a coating, with the coating being non-conductive. For example, as discussed above, particles of hafnium oxide ($HfO_2$) may be provided with a coating of alumina ($Al_2O_3$) prior to adding the hafnium oxide ($HfO_2$) in the bath. The alumina ($Al_2O_3$) may assist in more evenly dispersing the hafnium oxide ($HfO_2$) in the bath, but is not conductive.

The ceramic particles may include uniform particles, bare particles, or non-functionalized particles. For example, the ceramic material may comprise a plurality of substantially pure ceramic crystals. Such particles may, for example, contain "impurities" within their crystal structure, but are devoid of a coating, and are generally comprised of a single, uniform material.

As also indicated above, in embodiments, the dielectric layer 418 can be formed by concurrent electrodeposition of both a ceramic material 406 and a polymer material 410. For example, the ceramic material 406 may be described as above. The polymer material 410 may also be comprised of a plurality of particles that do not have a conductive coating, or are non-conductively coated or treated. For example, the polymer material 410 may comprise a plurality of polymer particles that do not have a coating or surface treatment. In other embodiments, for example, the polymer material 410 may be comprised of a plurality of polymer particles that have been treated with a non-metallic surface chemical group. In embodiments, the polymer material 410 comprises a partially cured polymer, with monomers of the polymer being at least partially cross-linked.

The ceramic material 406 and the polymer material 410 can have different properties that should be taken into consideration when selecting the materials that will form the dielectric layer 418 for a given application. As one example, ceramic materials 406 generally have higher dielectric constants than the polymer materials 410. For example, different ceramic materials 406 may have dielectric constants that range from about 2 or 3 to about 30,000. Different polymer materials 410, on the other hand, may have dielectric constants that range from about 2 to about 5. As another example, ceramic materials 406 in general tend to result in more brittle dielectric layers, or dielectric layers 418 that may be chalky and more easily scratched, when compared to polymers 410. Thus, to obtain a dielectric layer 418 with a desired dielectric constant as well as desired mechanical properties for a given application, the type of ceramic material(s) 406 and polymer material(s) 410 should be considered, as well as the proportion of ceramic and polymer materials 406, 410 used to form the layer 418.

As discussed above, throw power is used to describe a particle's ability to be drawn toward a conductive substrate. The relative throw powers of the ceramic material 406 and polymer material 410 used to form an electrodeposited layer 418 may be selected to help control the proportion of each in the electrodeposited layer 418. For example, if the ceramic material 406 and the polymer material 410 have substantially the same throw power, then the ceramic material 406 and the polymer material 410 will be drawn to the conductive substrate 402 in substantially the same quantity, resulting in an electrodeposited layer 418 comprising generally the same proportion of ceramic material 406 and polymer material 410. In applications where a higher proportion of ceramic material 406 is desired (for example, an application where a relatively high dielectric constant is desired), a ceramic material 406 having a higher throw power than the polymer material 410 may be selected (with the polymer material 410 still having a sufficient throw power to be electrodeposited, at least to some extent, on the conductive substrate 402). In applications where a higher proportion of polymer material 410 is desired, a polymer material 410 having a higher throw power than the ceramic material 406 may be selected (with the ceramic material 406 still having a sufficient throw power to be electrodeposited, at least to some extent, on the conductive substrate 402). Generally speaking, the greater the disparity in throw power between the ceramic material 406 and the polymer material 410, the greater will be the disparity in proportion of the materials 406, 410 in the electrodeposited layer 418. Thus, the relative throw powers in addition to other given properties (such as dielectric constant) of the ceramic material 406 and the polymer material 410 may be taken into account when selecting the materials to provide an electrodeposited layer 418 with desired characteristics. In embodiments, the throw power of the ceramic material 406, the polymer material 410, or both may be altered by a surface treatment, for example, immersion of particles in a surfactant (such as a non-conductive surfactant or a surfactant that does not conductively coat the particles), to provide a desired ratio of throw powers of the ceramic material 406 and the polymer material 410 to arrive at desired characteristics for a given layer 418.

Further, through selection of appropriate materials and process parameters, thin film coats that are substantially thinner than certain known electrocoating techniques, such as those used with portions of automobile bodies, may be provided to, for example, an electrical contact. For example, in embodiments, layers of about one micron or thinner may be provided.

For example, for a desired layer thickness, the average size of ceramic crystals of the ceramic material may be selected to be an amount smaller than the desired layer thickness to account for any variance in the distribution of crystal size. The smaller the desired layer thickness, the smaller size of crystal will be required. For example, in certain embodiments, the average crystal size may be less than about 500 nanometers in diameter. As another example, in embodiments, the average crystal size may be less than about 250 nanometers. As one more example, in embodiments, the average crystal size may be less than about 50 nanometers. Generally, the polymer particles are smaller than the ceramic crystals, or may be configured to permit aligning of the polymer particles in a given orientation to allow a desired layer thickness. Process parameters are also controlled accordingly to provide for thinner layers that may be used with thin film technology. For example, more control over temperature, voltage, and solid content in the bath is generally required to provide layers of, for example, one micron or less. Generally, lower voltages are used for layers of, for example, one micron or less.

FIG. 5 is a diagram of chemically reactive electrodeposition system 500 in accordance with one embodiment. The deposition system 500 is used to chemically react two or more species with each other in order to deposit a dielectric layer 502 on a substrate 504. In the illustrated embodiment, the dielectric layer 502 may be similar to one or more of the dielectric layers 204 and/or 304 (shown in FIGS. 2 and 3) and the substrate 504 may be similar to the conductive substrate 202, 302 and/or the conductive layers 306 (shown in FIGS. 2 and 3).

The system 500 includes a container 506 that holds a fluid bath 508. The fluid bath 508 includes two or more chemically reactive species that react with each other to form the dielectric layer 502. The bath 508 may be a gaseous and/or liquid bath. In one embodiment, the chemically reactive species in the bath 508 include one or more reactive precursor materials 510, 512. By way of example only, the chemically reactive precursor material 510 or 512 can be hafnium chloride (HfCl$_4$) from within a fluid bath 508 that includes water. The precursor materials 510, 512 are materials that react in order to deposit one or more constituents of the dielectric layer 502 onto the substrate 504. In one embodiment, precursor materials 510, 512 may be the precursors boric acid (H$_2$BO$_3$) and dimethylformamide (DMF), respectively, which, upon reaction deposit onto the surface of the conductive substrate 504 to yield a material with a lower dielectric constant (Dk), such as boron nitride (BN). Alternatively, the precursor material 512 may be an aqueous solution that includes water and boric acid and/or DMF.

The substrate 504 is at least partially inserted into the bath 508. A conductive counter electrode 516 is inserted into the bath 508 and is joined with a power source 518, such as a battery or electrical power supply. The substrate 504 also is joined with the power source 518. A voltage potential is applied across the substrate 504 and the counter electrode 516 by the power source 518. The voltage potential draws the precursor materials 510, 512 toward the substrate 504 such that the precursor materials 510, 512 chemically react with each other to form the dielectric layer 502. For example, the precursor materials 510, 512 may react with each other at or near a surface 520 of the substrate 504. The reaction of the precursor materials 510, 512 forms a coating of a dielectric material on the substrate 504 and may create one or more byproducts 514. In a bath 508 that includes hafnium chloride (HfCl$_4$) and water as the precursor materials 510, 512, the precursor materials 510, 512 react to leave a dielectric layer 502 of hafnium oxide (HfO$_2$). Hydrochloric acid (HCl) may be formed as the byproduct 514 that remains in the bath 508. Alternatively, precursor materials 510, 512 may form different byproducts 514.

After the dielectric layer 502 is foamed on the substrate 504, one or more additional conductive layers, such as the conductive substrates 202 (shown in FIG. 2) and/or conductive layers 306 (shown in FIG. 3), may be deposited on the dielectric layer 502. In one embodiment, the additional conductive layers are deposited using electrodeposition, as described above. One or more additional dielectric layers 502 may then be formed on the additional conductive layers.

Figure 6:
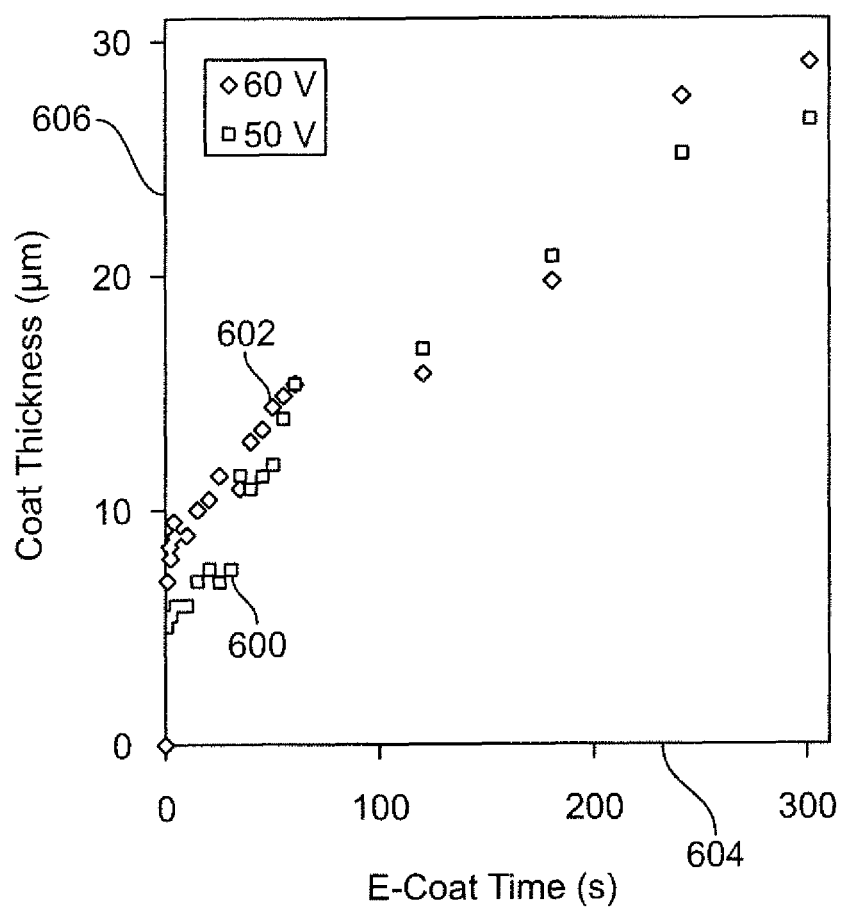
FIG. 6 is a graph illustrating first and second coat thicknesses with respect to time in accordance with one embodiment.

FIG. 6 is a graph illustrating first and second coat thicknesses 600, 602 with respect to time in accordance with one embodiment. The first and second coat thicknesses 600, 602 are shown alongside a horizontal axis 604 that represents time in seconds and a vertical axis 606 that represents distance in micrometers. The first and second coat thicknesses 600, 602 may represent thicknesses of the dielectric layer 418 or 502 (shown in FIGS. 4 and 5) that are deposited on the conductive substrates 402 or 504 (shown in FIGS. 4 and 5). The first or second coat thickness 600 or 602 of a dielectric layer 418 or 502 can be tailored based on one or more parameters of the process used to deposit the dielectric layer 418 or 502 on the conductive substrate 402 or 504. For example, the first or second coat thickness 600 or 602 may be based on a deposition time and/or a voltage potential between the counter electrode 416, 516 (shown in FIGS. 4 and 5) and the conductive substrate 402, 504.

In the illustrated embodiment, the first coat thickness 602 represents the thickness of the dielectric layer 418 or 502 (shown in FIGS. 4 and 5) that is deposited onto the conductive substrate 402 or 504 (shown in FIGS. 4 and 5) when the potential voltage between the counter electrode 416 or 516 (shown in FIGS. 4 and 5) and the conductive substrate 402 or 504 is 50 volts. The second coat thickness 602 represents the thickness of the dielectric layer 418 or 502 when the potential voltage between the counter electrode 416 or 516 and the conductive substrate 402 or 504 is 60 volts. Depositing the dielectric layer 418 or 502 at a greater voltage potential can result in a thicker dielectric layer 418 or 502. As shown in FIG. 6, the second coat thickness 602 is greater than the first coat thickness 600 for most of the deposition times represented by the horizontal axis 604, except for the deposition times of between 100 and 200 seconds, where the first and second coat thicknesses 600, 602 are approximately the same. As the voltage potential increases, the electromagnetic forces that draw the dielectric material 406 (shown in FIG. 4), the polymer material 410 (shown in FIG. 4), and/or the precursor materials 510, 512 (shown in FIG. 5) to the conductive substrate 402 or 504 also increase. As the electromagnetic forces increase, the amount of dielectric material 406, polymer material 410, or precursor materials 510, 512 deposited on the conductive substrate 402 or 504 also may increase.

The coat thickness of the dielectric layer 418 or 502 (shown in FIGS. 4 and 5) may be controlled to achieve a desired separation distance between conductive members or layers of a capacitive member. For example, the first or second coat thickness 600 or 602 can be closely controlled in order to provide the dielectric layer 204 (shown in FIG. 2) between the conductive substrates 202 (shown in FIG. 2) with a predetermined thickness. The first or second coat thickness 600 or 602 may be controlled to vary the mass or weight of an electronic component. For example, if the dielectric layer 418 or 502 is disposed on the conductive substrate 402 or 504 as an insulating or corrosion-prevention layer, then the first or second coat thickness 600 or 602 may be controlled to ensure that the dielectric layer 418 or 502 is thick enough to electrically insulate the conductive substrate 402 or 504 and/or adequately protect the conductive substrate 402 or 504 from corrosion.

Figure 7:
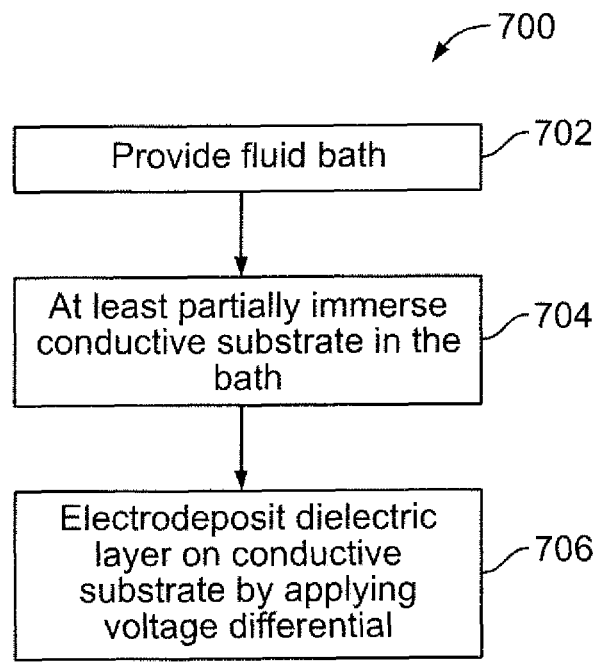
FIG. 7 is a flowchart of a method for electrodepositing a dielectric layer on a conductive substrate in accordance with one embodiment.

FIG. 7 is a flowchart of a method 700 for electrodepositing a dielectric layer on a conductive substrate in accordance with one embodiment. The method 700 may be used in connection with manufacturing a composite assembly for an electrical connector. At 702, a fluid bath is provided. The fluid bath includes a ceramic material dispersed within the fluid solvent of the bath. For example, the fluid bath 404 (shown in FIG. 4) with the dielectric material 406 (shown in FIG. 4) may be provided. In one embodiment, the fluid bath may include a polymer material, such as the polymer material 410 (shown in FIG. 4).

At 704, at least part of a conductive substrate is immersed or submerged into the fluid bath. For example, the conductive substrate 402 (shown in FIG. 4) may be partially placed into the fluid bath 404 (shown in FIG. 4).

At 706, a dielectric layer is deposited onto the conductive substrate by applying a voltage potential. For example, a voltage potential may be applied between the conductive substrate 402 (shown in FIG. 4) and the counter electrode 416 (shown in FIG. 4). As described above, the voltage potential drives the ceramic and/or polymer materials 406, 410 (shown in FIG. 4) in the bath 404 (shown in FIG. 4) to the conductive substrate 402 and forms an electrodeposited dielectric layer 418 (shown in FIG. 4) on the conductive substrate 402.

Figure 8:
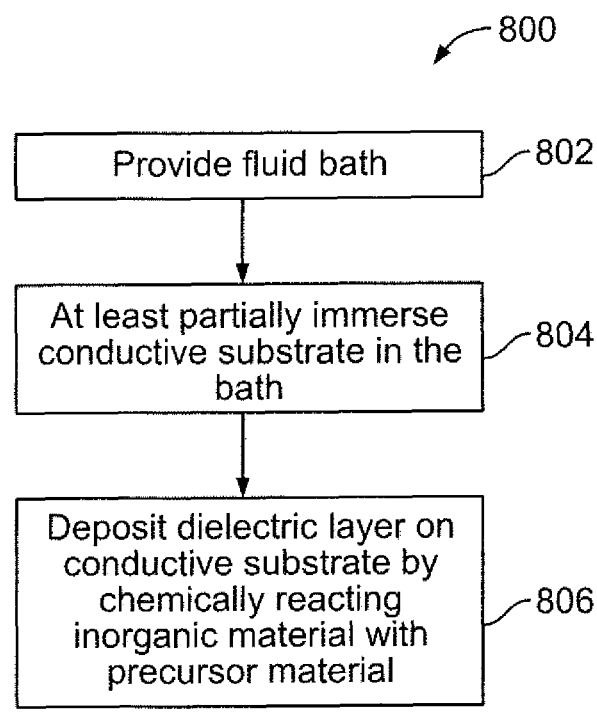
FIG. 8 is a flowchart of a method for electrochemically depositing a dielectric layer on a conductive substrate in accordance with one embodiment.

FIG. 8 is a flowchart of a method 800 for chemically electrodepositing a dielectric layer on a conductive substrate in accordance with one embodiment. The method 800 may be used in connection with manufacturing a composite assembly for an electrical connector. At 802, a fluid bath is provided. The fluid bath includes one or more reactive precursor materials 510, 512 (shown in FIG. 5).

At 804, at least part of a conductive substrate is immersed or submerged into the fluid bath. For example, the conductive substrate 504 (shown in FIG. 5) may be partially placed into the fluid bath 508 (shown in FIG. 5).

At 806, a dielectric layer is deposited onto the conductive substrate by chemically reacting precursor materials on the surface of the conductive substrate in the fluid bath. For example, as described above, a potential voltage may be applied between the counter electrode 516 (shown in FIG. 5) and the conductive substrate 504 (shown in FIG. 5) to draw the precursor materials 510, 512 (shown in FIG. 5) toward the conductive substrate 504 and to chemically react the precursor materials 510, 512 to deposit the dielectric layer 502 (shown in FIG. 5) on the conductive substrate 504.

In accordance with one or more embodiments described herein, a dielectric layer 418, 502 (shown in FIGS. 4 and 5) may form an approximately uniform coating on a conductive substrate 402, 504 (shown in FIGS. 4 and 5). The dielectric layer 418, 502 may be deposited onto the conductive substrate 402, 504 in order to form an integral or inherent capacitive member for a contact or other conductive component of an electrical connector. Alternatively, the dielectric layer 418, 502 is deposited onto the conductive substrate 402, 504 to provide electrical insulation of the conductive substrate 402, 504. For example, the dielectric layer 418, 502 may be deposited onto and cover the portions of the conductive substrate 402, 504 that are exposed. The dielectric layer 418, 502 can be deposited on the exposed portions of the conductive substrate 402, 504 to prevent electrical shorts between the exposed portions of the conductive substrate 402, 504 and other components. The dielectric layer 418, 502 can be deposited on the exposed portions of the conductive substrate 402, 504 to protect users of a connector that includes the conductive substrate 402, 504 from electrical shock. For example, if the conductive substrate 402, 504 is used in a device to convey electric power between components of the device, the dielectric layer 418, 502 can coat the conductive substrate 402, 504 to protect users from electric shock when current is transmitted using the conductive substrate 402, 504.

The dielectric layer 418, 502 (shown in FIGS. 4 and 5) may be deposited onto the conductive substrate 402, 504 (shown in FIGS. 4 and 5) to provide protection from corrosion of the conductive substrate 402, 504. For example, the dielectric layer 418, 502 may be deposited onto and cover the portions of the conductive substrate 402, 504 that are exposed in order to prevent the metal or metal alloy of the conductive substrate 402, 504 from being corroded.

Dimensions, types of materials, orientations of the various components, and the number and positions of the various components described herein are intended to define parameters of certain embodiments, and are by no means limiting and are merely example embodiments. Many other embodiments and modifications within the spirit and scope of the claims will be apparent to those skilled in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A method of manufacturing a composite assembly for an electrical connector, the method comprising:
   providing a fluid bath;
   adding a ceramic material to the fluid bath, wherein the ceramic material comprises a plurality of ceramic particles, wherein the plurality of ceramic particles is devoid of a conductive coating;
   immersing at least part of a conductive substrate in the fluid bath; and
   applying a voltage potential between the fluid bath and the conductive substrate, whereby the ceramic material is electrodeposited onto the conductive substrate as at least a portion of a dielectric layer.

2. The method of claim 1, further comprising adding a polymer to the fluid bath, whereby the polymer and the ceramic material are concurrently electrodeposited onto the conductive substrate.

3. The method of claim 2, wherein the polymer and the ceramic material have substantially similar throw powers, and wherein the polymer and the ceramic material are electrodeposited at about the same rate.

4. The method of claim 2, wherein the polymer and the ceramic material have substantially different throw powers, and wherein the polymer and the ceramic material are electrodeposited at substantially different rates corresponding to the substantially different throw powers.

5. The method of claim 1, wherein the ceramic material comprises a plurality of substantially pure crystal particles less than about 250 nanometers in diameter.

6. The method of claim 1, wherein the ceramic material comprises a plurality of coated particles that have a non-conductive coating.

7. The method of claim 1, further comprising electrodepositing an additional conductive layer onto the dielectric layer.

8. The method of claim 7, further comprising electrodepositing an additional dielectric layer onto the additional conductive layer.

9. A method of manufacturing a composite assembly for an electrical connector, the method comprising:
   providing a fluid bath;
   adding a ceramic material to the fluid bath, wherein the ceramic material comprises a plurality of ceramic particles, wherein the plurality of ceramic particles is devoid of a conductive coating;
   adding a polymer to the fluid bath, wherein the polymer comprises a plurality of polymer particles, wherein the plurality of polymer particles is devoid of a conductive coating;
   immersing at least part of a conductive substrate in the fluid bath; and
   applying a voltage potential between the fluid bath and the conductive substrate, whereby the plurality of ceramic particles and the plurality of polymer particles are concurrently electrodeposited onto the conductive substrate as a dielectric layer.

10. The method of claim 9, wherein the polymer and the ceramic material have substantially similar throw powers, and wherein the polymer and the ceramic material are electrodeposited at about the same rate.

11. The method of claim 9, wherein the polymer and the ceramic material have substantially different throw powers, and wherein the polymer and the ceramic material are electrodeposited at substantially different rates corresponding to the substantially different throw powers.

12. The method of claim 9, wherein the ceramic material comprises a plurality of substantially pure crystal particles less than about 250 nanometers in diameter.

13. The method of claim 9, wherein the ceramic material comprises a plurality of coated particles that have a non-conductive coating.

14. The method of claim 9, further comprising electrodepositing an additional conductive layer onto the dielectric layer.

15. The method of claim 14, further comprising electrodepositing an additional dielectric layer onto the additional conductive layer.

16. An electrical contact, the contact comprising:
a first conductive substrate;
a second conductive substrate; and
an electrodeposited thin film layer interposed between the first and second conductive substrates, the electrodeposited thin film layer comprising a ceramic material, the ceramic material comprising a plurality of ceramic particles devoid of a conductive coating.

17. The electrical contact of claim 16 wherein the electrodeposited thin film layer further comprises a plurality of electrodeposited polymer particles.

18. The electrical contact of claim 16, wherein the ceramic material comprises a plurality of substantially pure crystal particles less than about 250 nanometers in diameter.

19. The electrical contact of claim 16, further comprising one or more additional dielectric layers and one or more additional conductive layers.

* * * * *